United States Patent
Kobayakawa

(10) Patent No.: US 10,074,645 B2
(45) Date of Patent: Sep. 11, 2018

(54) LED MODULE AND METHOD OF MANUFACTURING THE SAME

(71) Applicant: ROHM CO., LTD., Kyoto-shi, Kyoto (JP)

(72) Inventor: Masahiko Kobayakawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/827,966

(22) Filed: Nov. 30, 2017

(65) Prior Publication Data

US 2018/0090478 A1    Mar. 29, 2018

Related U.S. Application Data

(63) Continuation of application No. 15/378,673, filed on Dec. 14, 2016, now Pat. No. 9,865,585, which is a (Continued)

(30) Foreign Application Priority Data

May 15, 2013 (JP) .................................. 2013-103126

(51) Int. Cl.
*H01L 33/54* (2010.01)
*H01L 27/02* (2006.01)
(Continued)

(52) U.S. Cl.
CPC ........ *H01L 27/0248* (2013.01); *H01L 25/167* (2013.01); *H01L 29/866* (2013.01);
(Continued)

(58) Field of Classification Search
CPC ... H01L 25/0753; H01L 33/62; H01L 27/156; H01L 2224/48247; H01L 2224/73265;
(Continued)

(56) References Cited

U.S. PATENT DOCUMENTS 8,487,418 B2    7/2013  Egoshi et al.
2009/0230413 A1*  9/2009  Kobayakawa ........ H01L 33/483
                                                257/91
(Continued)

FOREIGN PATENT DOCUMENTS

JP    2000-231363    8/2000
JP    2004-228387    8/2004
(Continued)

OTHER PUBLICATIONS

Office Action issued in corresponding Japanese Patent Application, dated Dec. 13, 2016, and corresponding English machine translation.

*Primary Examiner* — William Carter
(74) *Attorney, Agent, or Firm* — Hamre, Schumann, Mueller & Larson, P.C.

(57) ABSTRACT

A compact LED module and a method of manufacturing such an LED module are provided. The LED module includes a first-pole first lead, a first-pole second lead, a first-pole third lead, a second-pole first lead, a second-pole second lead, a second-pole third lead, a first LED chip, a second LED chip, a third LED chip, and a housing. A distal end of the first-pole first lead is offset toward a second-pole side in a first direction with respect to both a distal end of the second-pole second lead and a distal end of the second-pole third lead.

10 Claims, 17 Drawing Sheets

Related U.S. Application Data continuation of application No. 14/275,191, filed on May 12, 2014, now Pat. No. 9,553,077.

(51) Int. Cl.
  *H01L 29/866* (2006.01)
  *H01L 25/16* (2006.01)
  *H01L 33/62* (2010.01)
  *H01L 33/48* (2010.01)

(52) U.S. Cl.
  CPC ............ *H01L 33/486* (2013.01); *H01L 33/62* (2013.01); *H01L 2933/0066* (2013.01)

(58) Field of Classification Search
  CPC .. H01L 27/3218; H01L 33/54; H01L 27/3276
  USPC ...................................................... 257/89–91
  See application file for complete search history.

(56) References Cited

U.S. PATENT DOCUMENTS

| | | | |
|---|---|---|---|
| 2010/0155748 A1* | 6/2010 | Chan | H01L 33/62 257/89 |
| 2011/0186875 A1* | 8/2011 | Egoshi | H01L 33/48 257/89 |
| 2012/0056218 A1 | 3/2012 | Abdul Karim et al. | |

FOREIGN PATENT DOCUMENTS

| | | |
|---|---|---|
| JP | 2006-147622 | 6/2006 |
| JP | 2007-251167 | 9/2007 |
| JP | 2010-206138 | 9/2010 |
| JP | 2011-176264 | 9/2011 |
| JP | 2011-254008 | 12/2011 |
| JP | 2012-142426 | 7/2012 |
| JP | 2013-55190 | 3/2013 |
| JP | 2013-62493 | 4/2013 |

\* cited by examiner

LED MODULE AND METHOD OF MANUFACTURING THE SAME

BACKGROUND OF THE INVENTION

1. Field of the Invention

The present invention relates to an LED module, and a method of manufacturing LED modules.

2. Description of the Related Art

An example of conventional LED modules is disclosed in FIG. 6 of JP 2011-176264 A. The LED module disclosed therein includes three primary leads arranged on the right side and three cooperating or secondary leads arranged on the left side. The conventional LED module also includes three LED chips mounted on the three primary leads, respectively, and these LED chips are connected via wires to the three secondary leads, respectively.

In the conventional LED module, the primary leads are spaced from the corresponding secondary leads by the same distance in the X-direction, so that there is a gap of the same width formed between each one of the primary leads and the corresponding one of the secondary leads (three gaps in total). As shown in the figure, the three gaps of the same width are elongated in the Y-direction and aligned straight in the Y-direction.

The conventional leads with the above arrangements can be formed from a metal plate by a relatively simple process including presswork such as stamping. However, the mount locations of the three LED chips and the bonding positions of the wires may unduly be limited in variation, which is not suitable to produce a compact LED module.

SUMMARY OF THE INVENTION

The present invention has been proposed under the foregoing circumstances. It is therefore an object of the present invention to provide an LED module that can be formed in a smaller size, and also to provide a manufacturing method of such an LED module.

According to a first aspect of the present invention, there is provided an LED module including: a first-pole first lead, a first-pole second lead, and a first-pole third lead located on a first-pole side in a first direction; a second-pole first lead, a second-pole second lead, and a second-pole third lead located on a second-pole side opposite the first-pole side in the first direction; a first LED chip electrically connected to the first-pole first lead and the second-pole first lead; a second LED chip electrically connected to the first-pole second lead and the second-pole second lead; a third LED chip electrically connected to the first-pole third lead and the second-pole third lead; a housing covering at least a part of each of the first-pole first lead, the first-pole second lead, the first-pole third lead, the second-pole first lead, the second-pole second lead and the second-pole third lead. A distal end of the first-pole first lead and a distal end of the second-pole first lead are opposed to each other in the first direction, a distal end of the first-pole second lead and a distal end of the second-pole second lead are opposed to each other in the first direction, and a distal end of the first-pole third lead and a distal end of the second-pole third lead are opposed to each other in the first direction. The first-pole first lead is located between the first-pole second lead and the first-pole third lead in a second direction orthogonal to the first direction, and the second-pole first lead is located between the second-pole second lead and the second-pole third lead in the second direction. The first LED chip is mounted on the first-pole first lead, the second LED chip is mounted on the second-pole second lead, and the third LED chip is mounted on the second-pole third lead. The distal end of the first-pole first lead is offset toward the second-pole side in the first direction with respect to the distal end of the second-pole second lead and the distal end of the second-pole third lead.

According to a second aspect of the present invention, there is provided a method of manufacturing an LED module. The method includes the steps of: preparing a metal plate that is formed with an opening and includes a first-pole first bulging portion projecting into the opening from a first-pole side toward a second-pole side opposite the first-pole side in a first direction, the metal plate also including a second-pole second bulging portion and a second-pole third bulging portion flanking the first-pole first bulging portion in a second direction orthogonal to the first direction, each of the second-pole second bulging portion and the second-pole third bulging portion being configured to project into the opening from the second-pole side toward the first-pole side in the first direction; stretching the first-pole first bulging portion in the first direction toward the second-pole side; stretching the second-pole second bulging portion and the second-pole third bulging portion in the first direction toward the first-pole side; and mounting a first LED chip, a second LED chip and a third LED chip on the first-pole first bulging portion, the second-pole second bulging portion and the second-pole third bulging portion, respectively.

Other features and advantages of the present invention will become more apparent through detailed description given hereunder with reference to the accompanying drawings.

DETAILED DESCRIPTION OF THE PREFERRED EMBODIMENTS

Preferred embodiments of the present invention will be described below with reference to the drawings.

Figure 1:
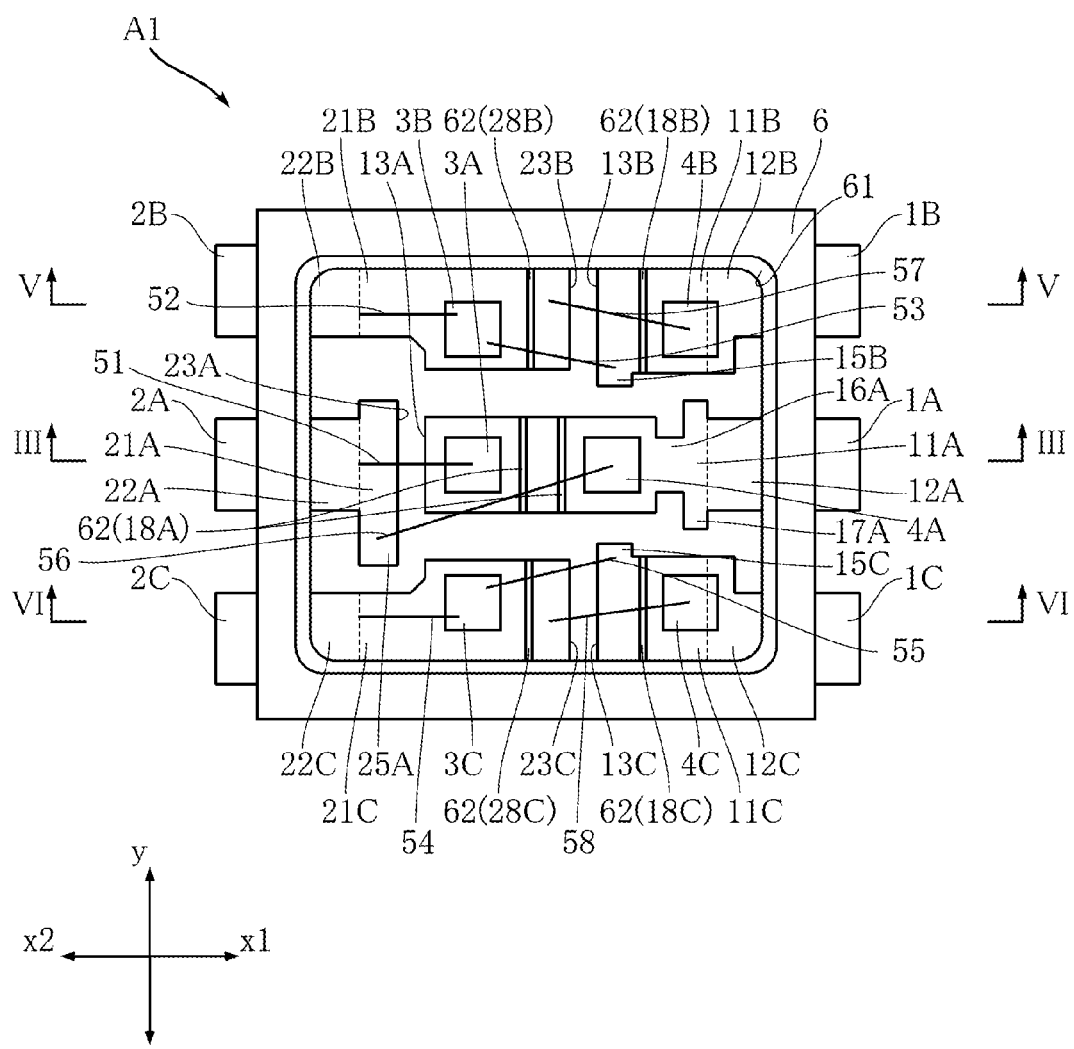
FIG. 1 is a plan view of an LED module according to a first embodiment of the present invention.
Figure 2:
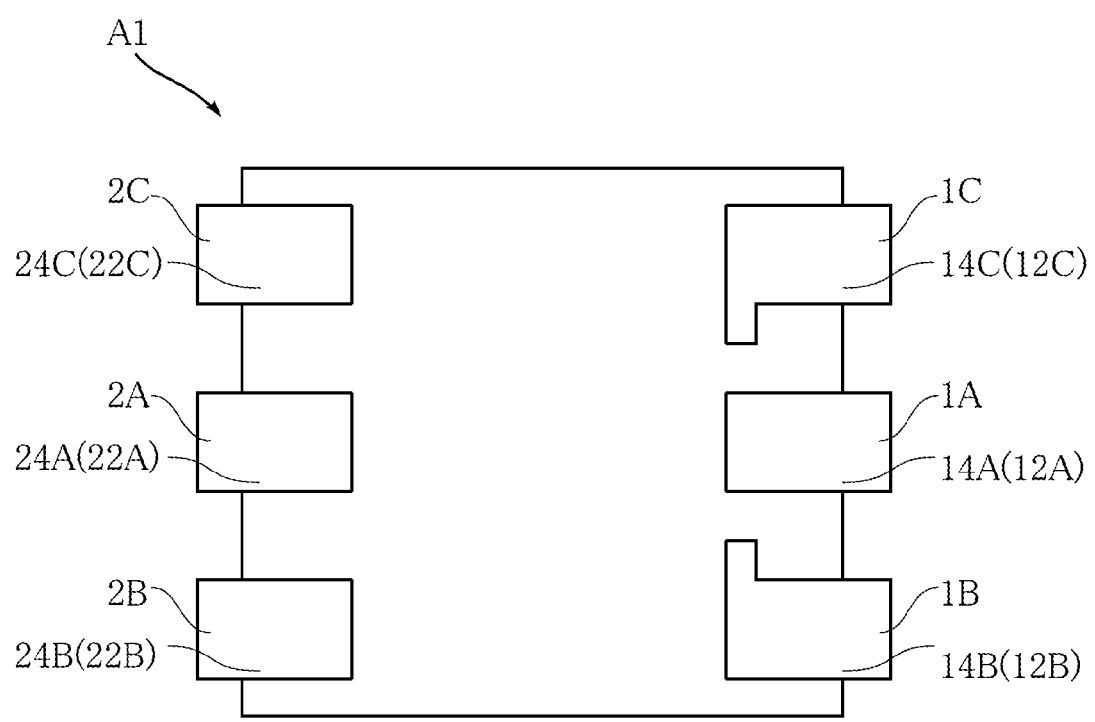
FIG. 2 is a bottom view of the LED module shown in FIG. 1.
Figure 2:
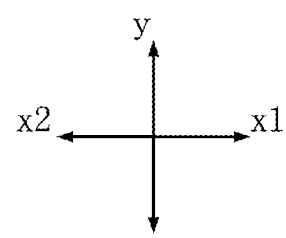

FIGS. 1 to 6 illustrate an LED module according to a first embodiment of the present invention. The LED module A1 according to this embodiment includes six leads, that is, a first-pole first lead 1A, a second-pole first lead 2A, first-pole second lead 1B, a second-pole second lead 2B, a first-pole third lead 1C, and a second-pole third lead 2C. In the illustrated example, the three "first-pole" leads 1A-1C are arranged on the right side of the module, while the three "second-pole" leads 2A-2C are arranged on the left side of the module. Further, the LED module A1 includes a first LED chip 3A, a second LED chip 3B, a third LED chip 3C, a first Zener diode 4A, a second Zener diode 4B, a third Zener diode 4C, wires 51 to 58, a housing 6, and an encapsulating resin 7. In FIG. 1, the encapsulating resin 7 is not shown for the sake of simplicity. In the figures, the x1-direction corresponds to the "first-pole side in the first direction" in the present invention, and an x2-direction corresponds to the "second-pole side in the first direction" in the present invention. The y-direction, orthogonal to the x-direction, corresponds to the "second direction" in the present invention, and the z-direction is orthogonal to both the x1-x2-direction and the y-direction.

The first-pole first lead 1A, the second-pole first lead 2A, the first-pole second lead 1B, the second-pole second lead 2B, the first-pole third lead 1C and the second-pole third lead 2C serve to support the first LED chip 3A, the second LED chip 3B, and the third LED chip 3C and/or constitute current paths to cause the LED chips to emit light. The leads mentioned above are formed of, for example, Cu or Ni or an alloy of these metals.

The first-pole first lead 1A is located on the x1-direction side, and at a generally central position in the y-direction. The first-pole first lead 1A has a strip-like shape extending in the x1-x2-direction, and includes a thin portion 11A, a thick portion 12A, a distal end 13A, a terminal portion 14A, a narrowed portion 16A, a widened portion 17A, and a pair of grooves 18A.

Figure 3:
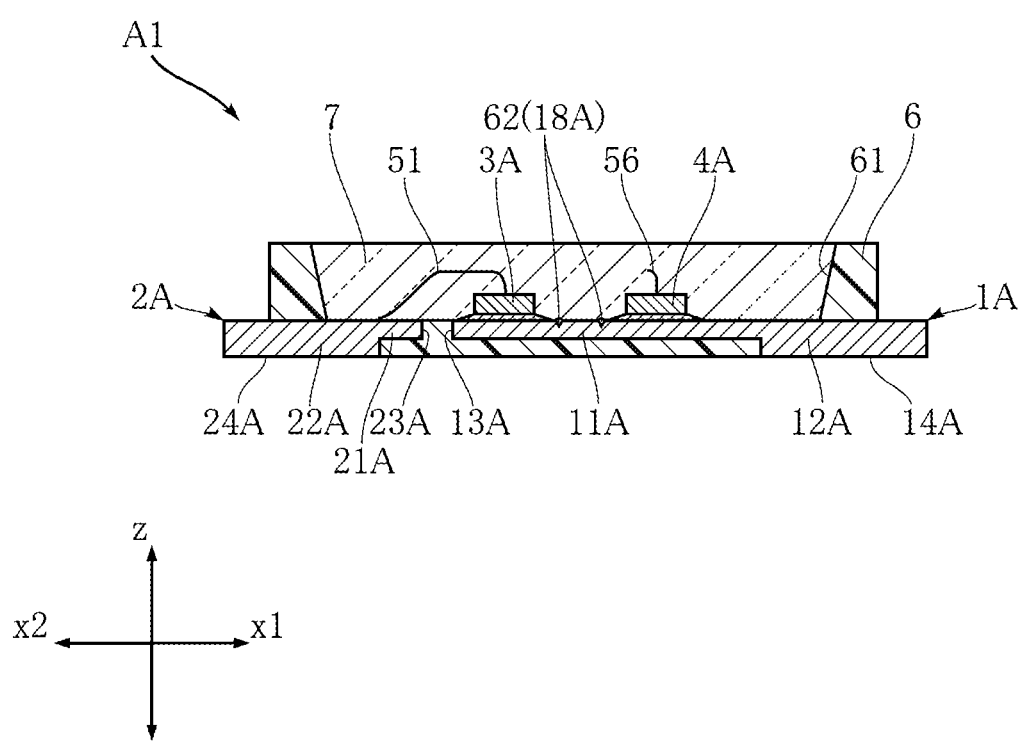
FIG. 3 is a cross-sectional view taken along a line III-III in FIG. 1.

The thin portion 11A, having relatively small thickness compared with the other portions of the lead 1A, is located on the x2-direction side in the first-pole first lead 1A. The thick portion 12A, having a greater thickness than the thin portion 11A, is located on the x1-direction side in the first-pole first lead 1A. The boundary between the thin portion 11A and the thick portion 12A (broken line in FIG. 1) is parallel to the y-direction. As shown in FIG. 3, the respective upper faces of the thin portion 11A and the thick portion 12A are flush with each other. The lower face of the thin portion 11A is covered with the housing 6 so as not to be exposed to the outside, while the lower face of the thick portion 12A is exposed from the housing 6.

The distal end 13A, located at the farthest position on the x2-direction side in the first-pole first lead 1A, is formed as an edge parallel to the y-direction. The terminal portion 14A is a portion via which the LED module A1 is mounted on e.g. a circuit board, and provided by the portion of the thick portion 12A exposed from the housing 6.

The narrowed portion 16A has a relatively small width (i.e., smaller width than the adjacent portions flanking the portion 16A in the x1-x2-direction) in the y-direction. The widened portion 17A has a relatively great width (i.e., greater width than the adjacent portions flanking the portion 17A in the x1-x2-direction) in the y-direction. The widened portion 17A is located on the x1-direction side from the narrowed portion 16A. Having the relatively small width, the narrowed portion 16A has recessed ends in the y-direction. The widened portion 17A, on the other hand, protrudes in the y-direction (more precisely, in the opposite senses of the y-direction).

Figure 4:
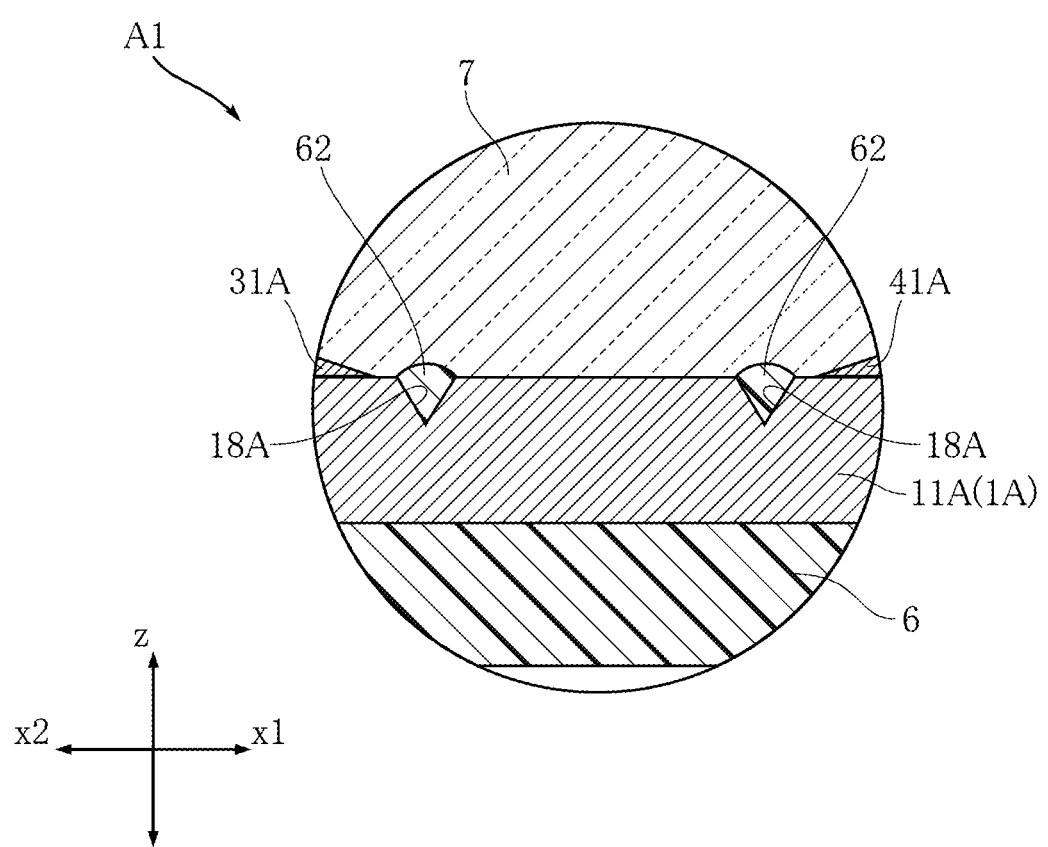
FIG. 4 is a cross-sectional view of the LED module shown in FIG. 1.

The grooves 18A are formed to cross the first-pole first lead 1A, each extending in the y-direction from one edge to the other edge of the lead 1A. The grooves 18A are located between the distal end 13A and the narrowed portion 16A. In the illustrated example, the grooves 18A have a triangular cross-section as shown in FIG. 4, but the grooves 18A may be formed with a different cross-sectional shape.

In this embodiment, the distal end 13A, the narrowed portion 16A, the widened portion 17A, and the pair of grooves 18A are located at the thin portion 11A.

The second-pole first lead 2A is located on the x2-direction side with respect to the first-pole first lead 1A, and at a generally central position in the y-direction. The second-pole first lead 2A has a strip-like shape extending in the x1-x2-direction, and includes a thin portion 21A, a thick portion 22A, a distal end 23A, a terminal portion 24A, and a bulging portion 25A.

The thin portion 21A, having a relatively small thickness compared with the other portions of the lead 2A, is located on the x1-direction side in the second-pole first lead 2A. The thick portion 22A, having a greater thickness than the thin portion 21A, is located on the x2-direction side in the second-pole first lead 2A. The boundary between the thin portion 21A and the thick portion 22A (broken line in FIG. 1) is parallel to the y-direction. As shown in FIG. 3, the respective upper faces of the thin portion 21A and the thick portion 22A are flush with each other. The lower face of the thin portion 21A is covered with the housing 6, and the lower face of the thick portion 22A is exposed from the housing 6.

The distal end 23A, located at the farthest position on the x1-direction side in the second-pole first lead 2A, is formed as an edge parallel to the y-direction. The distal end 23A is opposed to the distal end 13A of the first-pole first lead 1A in the x1-x2-direction, with a gap therebetween. The terminal portion 24A is a portion via which the LED module A1 is mounted on a circuit board for example, and provided by the portion of the thick portion 22A exposed from the housing 6.

The bulging portion 25A is located on the x1-direction side of the lead, and protrudes downward in the y-direction in FIG. 1, i.e., toward the second-pole third lead 2C.

In this embodiment, the distal end 23A and the bulging portion 25A are located at the thin portion 21A.

The first-pole second lead 1B is located on the x1-direction side, and on the upper side of the first-pole first lead 1A in the y-direction as shown in FIG. 1. The first-pole second lead 1B has a strip-like shape extending in the x1-x2-direction, and includes a thin portion 11B, a thick portion 12B, a distal end 13B, a terminal portion 14B, a bulging portion 15B and a groove 18B.

Figure 5:
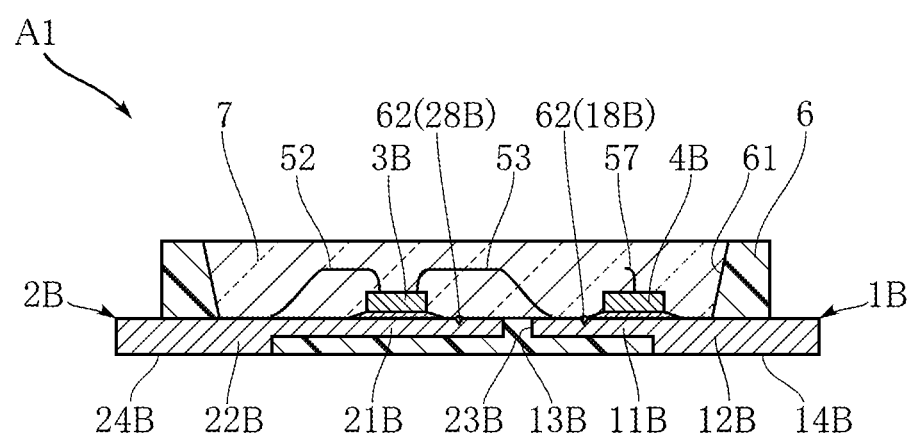
FIG. 5 is a cross-sectional view taken along a line V-V in FIG. 1.
Figure 5:
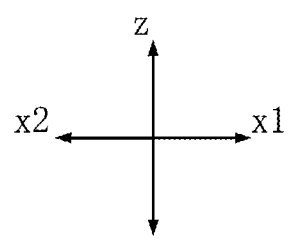

The thin portion 11B, having a relatively small thickness compared with the other portions of the lead 1B, is located on the x2-direction side in the first-pole second lead 1B. The thick portion 12B, having a greater thickness than the thin portion 11B, is located on the x1-direction side in the first-pole second lead 1B. The boundary between the thin portion 11B and the thick portion 12B (broken line in FIG. 1) is parallel to the y-direction. As shown in FIG. 5, the respective upper faces of the thin portion 11B and the thick portion 12B are flush with each other. The lower face of the thin portion 11B is covered with the housing 6, and the lower face of the thick portion 12B is exposed from the housing 6.

The distal end 13B, located at the farthest position on the x2-direction side in the first-pole second lead 1B, is formed as an edge parallel to the y-direction. The terminal portion 14B is a portion via which the LED module A1 is mounted on a circuit board for example, and provided by the portion of the thick portion 12B exposed from the housing 6.

The bulging portion 15B is located on the x2-direction side, and protrudes downward in the y-direction in FIG. 1, i.e., toward the first-pole first lead 1A.

The groove 18B is formed throughout the first-pole second lead 1B in the y-direction. The groove 18B is located on the x1-direction side from the distal end 13B and the bulging portion 15B. The groove 18B may have a cross-sectional shape like the one mentioned above with respect to the groove 18A.

In this embodiment, the distal end 13B, the bulging portion 15B, and the groove 18B are located at the thin portion 11B.

The second-pole second lead 2B is located on the x2-direction side with respect to the first-pole second lead 1B and, as shown in FIG. 1, on the upper side of the second-pole first lead 2A in the y-direction. The second-pole second lead 2B has a strip-like shape extending in the x1-x2-direction, and includes a thin portion 21B, a thick portion 22B, a distal end 23B, a terminal portion 24B, and a groove 28B.

The thin portion 21B, having a relatively small thickness compared with the other portions of the lead 2B, is located on the x1-direction side in the second-pole second lead 2B. The thick portion 22B, having a greater thickness than the thin portion 21B, is located on the x2-direction side in the second-pole second lead 2B. The boundary between the thin portion 21B and the thick portion 22B (broken line in FIG. 1) is parallel to the y-direction. As shown in FIG. 5, the respective upper faces of the thin portion 21B and the thick portion 22B are flush with each other. The lower face of the thin portion 21B is covered with the housing 6, and the lower face of the thick portion 22B is exposed from the housing 6.

The distal end 23B, located at the farthest position on the x1-direction side in the second-pole second lead 2B, is formed as an edge parallel to the y-direction. The distal end 23B is opposed to the distal end 13B of the first-pole second lead 1B in the x1-x2-direction, with a gap therebetween. The terminal portion 24B is a portion via which the LED module A1 is mounted on a circuit board for example, and provided by the portion of the thick portion 22B exposed from the housing 6.

The groove 28B is formed throughout the second-pole second lead 2B in the y-direction. The groove 28B may have a cross-sectional shape like the one mentioned above with respect to the groove 18A.

A portion of the second-pole second lead 2B overlapping the bulging portion 25A of the second-pole first lead 2A in the x1-x2-direction is smaller in size in the y-direction than a portion on the x1-direction side. In other words, the portion of the second-pole second lead 2B on the x2-direction side is recessed upward in the y-direction in FIG. 1.

In this embodiment, the distal end 23B and the groove 28B are located at the thin portion 21B.

The first-pole third lead 1C is located on the x1-direction side and on the lower side of the first-pole first lead 1A in the y-direction, as shown in FIG. 1. The first-pole third lead 1C has a strip-like shape extending in the x1-x2-direction, and includes a thin portion 11C, a thick portion 12C, a distal end 13C, a terminal portion 14C, a bulging portion 15C, and a groove 18C.

Figure 6:
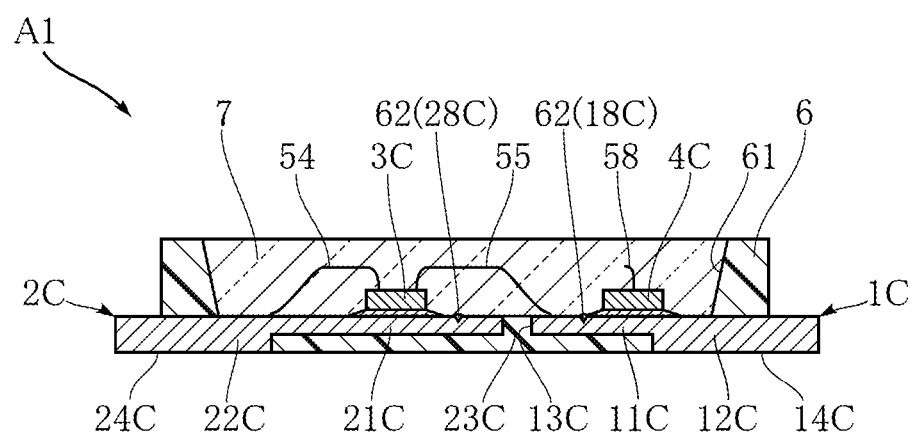
FIG. 6 is a cross-sectional view taken along a line VI-VI in FIG. 1.
Figure 6:
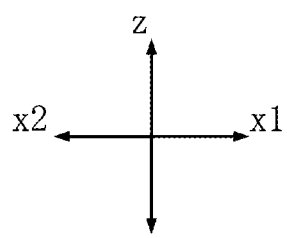

The thin portion 11C, having a relatively small thickness compared with the other portions of the lead 1C, is located on the x2-direction side in the first-pole third lead 1C. The thick portion 12C, having a greater thickness than the thin portion 11C, is located on the x1-direction side in the first-pole third lead 1C. The boundary between the thin portion 11C and the thick portion 12C (broken line in FIG. 1) is parallel to the y-direction. As shown in FIG. 6, the respective upper faces of the thin portion 11C and the thick portion 12C are flush with each other. The lower face of the thin portion 11C is covered with the housing 6, and the lower face of the thick portion 12C is exposed from the housing 6.

The distal end 13C, located at the farthest position on the x2-direction side in the first-pole third lead 1C, is formed as an edge parallel to the y-direction. The terminal portion 14C is a portion via which the LED module A1 is mounted on a circuit board for example, and provided by the portion of the thick portion 12C exposed from the housing 6.

The bulging portion 15C is located on the x2-direction side, and protrudes upward in the y-direction in FIG. 1, i.e., toward the first-pole first lead 1A.

The groove 18C is formed throughout the first-pole third lead 1C in the y-direction. The groove 18C is located on the x1-direction side from the distal end 13C and the bulging portion 15C. The groove 18C may have a cross-sectional shape like the one mentioned above with respect to the groove 18A.

In this embodiment, the distal end 13C, the bulging portion 15C, and the groove 18C are located at the thin portion 11C.

The second-pole third lead 2C is located on the x2-direction side with respect to the first-pole third lead 1C and, as shown in FIG. 1, on the lower side of the second-pole first lead 2A in the y-direction. The second-pole third lead 2C has a strip-like shape extending in the x1-x2-direction, and includes a thin portion 21C, a thick portion 22C, a distal end 23C, a terminal portion 24C, and a groove 28C.

The thin portion 21C, having a relatively small thickness compared with the other portions of the lead 2C, is located on the x1-direction side in the second-pole third lead 2C. The thick portion 22C, having a greater thickness than the thin portion 21C, is located on the x2-direction side in the second-pole third lead 2C. The boundary between the thin portion 21C and the thick portion 22C (broken line in FIG. 1) is parallel to the v-direction. As shown in FIG. 6, the respective upper faces of the thin portion 21C and the thick portion 22C are flush with each other. The lower face of the thin portion 21C is covered with the housing 6, and the lower face of the thick portion 22C is exposed from the housing 6.

The distal end 23C, located at the farthest position on the x1-direction side in the second-pole third lead 2C, is formed as an edge parallel to the y-direction. The distal end 23C is opposed to the distal end 13C of the first-pole third lead 1C in the x1-x2-direction, with a gap therebetween. The terminal portion 24C is a portion via which the LED module A1 is mounted on a circuit board for example, and provided by the portion of the thick portion 22C exposed from the housing 6.

The groove 28C is formed throughout the second-pole third lead 2C in the y-direction. The groove 28C may have a cross-sectional shape like the one mentioned above with respect to the groove 18A.

A portion of the second-pole third lead 2C overlapping the bulging portion 25A of the second-pole first lead 2A in the x1-x2-direction is smaller in size in the y-direction than a portion on the x1-direction side. In other words, the portion of the second-pole third lead 2C on the x2-direction side is recessed downward in the y-direction in FIG. 1.

In this embodiment, the distal end 23C and the groove 28C are located at the thin portion 21C.

The first LED chip 3A is mounted on the thin portion 11A of the first-pole first lead 1A, and configured to emit red light in this embodiment. The first LED chip 3A is a so-called 1-wire LED chip, and has a non-illustrated upper electrode connected to the second-pole first lead 2A via the wire 51. A non-illustrated lower electrode of the first LED chip 3A is joined to the first-pole first lead 1A via an electroconductive joint material such as an Ag paste or solder. The first LED chip 3A is located between the distal end 13A and the groove 18A on the first-pole first lead 1A.

The second LED chip 3B is mounted on the thin portion 21B of the second-pole second lead 2B, and configured to emit green light in this embodiment. The second LED chip 3B is a so-called 2-wire LED chip and includes a pair of non-illustrated upper electrodes, one of which is connected to the second-pole second lead 2B via the wire 52 and the other of which is connected to the first-pole second lead 1B via the wire 53. The wire 53 is bonded to the bulging portion 15B of the first-pole second lead 1B. In other words, the wire 53 is bonded to the first-pole second lead 1B at a position opposite to the second Zener diode 4B across the groove 18B. The second LED chip 3B is located on the x2-direction side of the groove 28B, on the second-pole second lead 2B. Further, the second LED chip 3B is located at the same position as the first LED chip 3A in the x1-x2-direction.

The third LED chip 3C is mounted on the thin portion 21C of the second-pole third lead 2C, and configured to emit blue light in this embodiment. The third LED chip 3C is a so-called 2-wire LED chip and includes a pair of non-illustrated upper electrodes, one of which is connected to the second-pole third lead 2C via the wire 54 and the other of which is connected to the first-pole third lead 1C via the wire 55. The wire 55 is bonded to the bulging portion 15C of the first-pole third lead 1C. In other words, the wire 55 is bonded to the first-pole third lead 1C at a position opposite to the third Zener diode 4C across the groove 18C. The third LED chip 3C is located on the x2-direction side of the groove 28C, on the second-pole third lead 2C. Further, the third LED chip 3C is located at the same position as the first LED chip 3A and the second LED chip 3B in the x1-x2-direction.

The first Zener diode 4A is mounted on the first-pole first lead 1A and serves to prevent the first LED chip 3A from being subjected to excessive reverse voltage. The first Zener diode 4A has a non-illustrated upper electrode connected to the second-pole first lead 2A via the wire 56. The wire 56 is bonded to the bulging portion 25A of the second-pole first lead 2A. A non-illustrated lower electrode of the first Zener diode 4A is joined to the first-pole first lead 1A via an electroconductive joint material. The first Zener diode 4A is located on the x1-direction side from the first LED chip 3A, and between the groove 18A and the narrowed portion 16A.

The second Zener diode 4B is mounted on the first-pole second lead 1B and serves to prevent the second LED chip 3B from being subjected to excessive reverse voltage. The second Zener diode 4B has a non-illustrated upper electrode connected to the second-pole second lead 2B via the wire 57. The wire 57 is bonded to the second-pole second lead 2B at a position between the distal end 23B and the groove 28B. A non-illustrated lower electrode of the second Zener diode 4B is joined to the first-pole second lead 1B via an electroconductive joint material. The second Zener diode 4B is located on the x1-direction side from the groove 18B.

The third Zener diode 4C is mounted on the first-pole third lead 1C and serves to prevent the third LED chip 3C from being subjected to excessive reverse voltage. The third Zener diode 4C has a non-illustrated upper electrode connected to the second-pole third lead 2C via the wire 58. The wire 58 is bonded to the second-pole third lead 2C at a position between the distal end 23C and the groove 28C. A non-illustrated lower electrode of the third Zener diode 4C is joined to the first-pole third lead 1C via an electroconductive joint material. The third Zener diode 4C is located on the x1-direction side from the groove 18C.

As shown in FIG. 1, the distal end 13A of the first-pole first lead 1A is located on the x2-direction side from the second LED chip 3B and the third LED chip 3C. In contrast, the distal end 23B of the second-pole second lead 2B and the distal end 23C of the second-pole third lead 2C are located on the x1-direction side from the first LED chip 3A.

The first Zener diode 4A is located on the x2-direction side from the second Zener diode 4B and the third Zener diode 4C. The second Zener diode 4B and the third Zener diode 4C are located at the same position in the x1-x2-direction.

The bulging portion 15B of the first-pole second lead 1B and the bulging portion 15C of the first-pole third lead 1C are located at the same position in the x1-x2-direction. The groove 18B of the first-pole second lead 1B and the groove 18C of the first-pole third lead 1C are located at the same position in the x1-x2-direction. The groove 28B of the second-pole second lead 2B and the groove 28C of the second-pole third lead 2C are located at the same position in the x1-x2-direction.

The boundary between the thin portion 11A and the thick portion 12A of the first-pole first lead 1A, the boundary between the thin portion 11B and the thick portion 12B of the first-pole second lead 1B, and the boundary between the thin portion 11C and the thick portion 12C of the first-pole third lead 1C are located at the same position in the x1-x2-direction. Likewise, the boundary between the thin portion 21A and the thick portion 22A of the second-pole first lead 2A, the boundary between the thin portion 21B and the thick portion 22B of the second-pole second lead 2B, and the boundary between the thin portion 21C and the thick portion 22C of the second-pole third lead 2C are located at the same position in the x1-x2-direction.

The housing 6 is formed of a white epoxy resin for example, and has a rectangular shape when viewed in the z-direction in this embodiment. The housing 6 partially covers each of the first-pole first lead 1A, the second-pole first lead 2A, the first-pole second lead 1B, the second-pole second lead 2B, the first-pole third lead 1C, and the second-pole third lead 2C.

The housing 6 includes a cavity 61. The cavity 61 has a rectangular shape when viewed in the z-direction, and accommodates therein the first LED chip 3A, the second LED chip 3B, the third LED chip 3C, the first Zener diode 4A, the second Zener diode 4B, and the third Zener diode 4C.

The housing 6 also includes a plurality of linear portions 62. The linear portions 62 are formed by fitting a part of the housing 6 in the pair of grooves 18A of the first-pole first lead 1A, the groove 18B of the first-pole second lead 1B, the groove 28B of the second-pole second lead 2B, the groove 18C of the first-pole third lead 1C, and the groove 28C of the second-pole third lead 2C. FIG. 4 illustrates the linear portions 62 fitted in the grooves 18A of the first-pole first lead 1A. As shown in FIG. 4, the linear portion 62 slightly protrudes from the upper surface of the first-pole first lead 1A. FIG. 4 also illustrates an electroconductive joint material 31A and an electroconductive joint material 41A. The electroconductive joint material 31A serves to bond the lower electrode of the first LED chip 3A to the first-pole first lead 1A. The electroconductive joint material 41A serves to bond the lower electrode of the first Zener diode 4A to the first-pole first lead 1A. The linear portions 62 fitted in the groove 18B of the first-pole second lead 1B, the groove 28B of the second-pole second lead 2B, the groove 18C of the first-pole third lead 1C, and the groove 28C of the second-pole third lead 2C are also configured in the same way as the linear portions 62 shown in FIG. 4.

The encapsulating resin 7 fills the cavity 61 of the housing 6, so as to cover the first LED chip 3A, the second LED chip 3B, the third LED chip 3C, the first Zener diode 4A, the second Zener diode 4B, and the third Zener diode 4C. The encapsulating resin 7 is formed of, for example, a transparent epoxy resin or silicone resin.

Referring now to FIGS. 7 through 16, an example of the manufacturing method of the LED module A1 will be described below.

Figure 7:
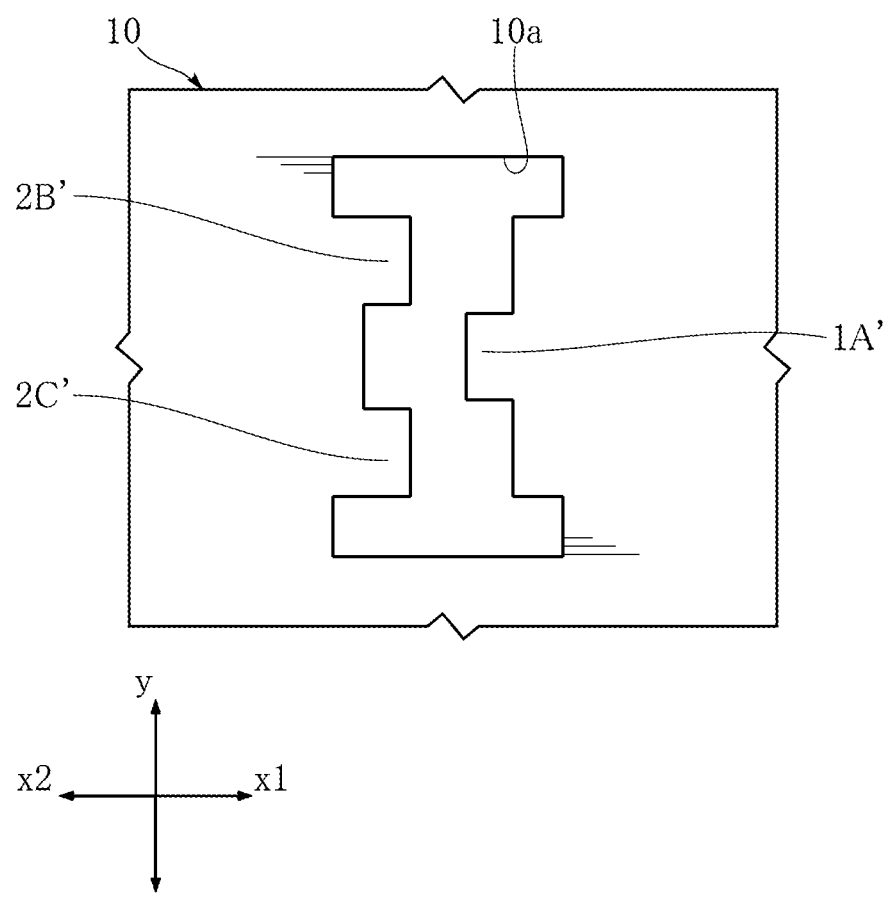
FIG. 7 is a plan view for explaining a manufacturing method of the LED module shown in FIG. 1.

First, as shown in FIG. 7, a metal plate 10 is prepared. The metal plate 10 is the material from which the first-pole first lead 1A, the second-pole first lead 2A, the first-pole second lead 1B, the second-pole second lead 2B, the first-pole third lead 1C, and the second-pole third lead 2C are to be formed. The metal plate 10 may be made of Cu or Ni or an alloy of these metals. The metal plate 10 includes an opening 10a formed so as to penetrate through the metal plate 10. The metal plate 10 also includes a first-pole first bulging portion 1A', a second-pole second bulging portion 2B', and a second-pole third bulging portion 2C'. The first-pole first bulging portion 1A' is located on the x1-direction side with respect to the opening 10a, and projects into the opening 10a toward the x2-direction side. The second-pole second bulging portion 2B' and the second-pole third bulging portion 2C' are located on the respective sides of the first-pole first bulging portion 1A' in the y-direction. The second-pole second bulging portion 2B' and the second-pole third bulging portion 2C' are located on the x2-direction side with respect to the opening 10a, and project into the opening 10a in the x1-direction. In the subsequent steps, the metal plate 10 is to be processed by prescribed stages. The process may be presswork such as stamping, for example.

Figure 8:
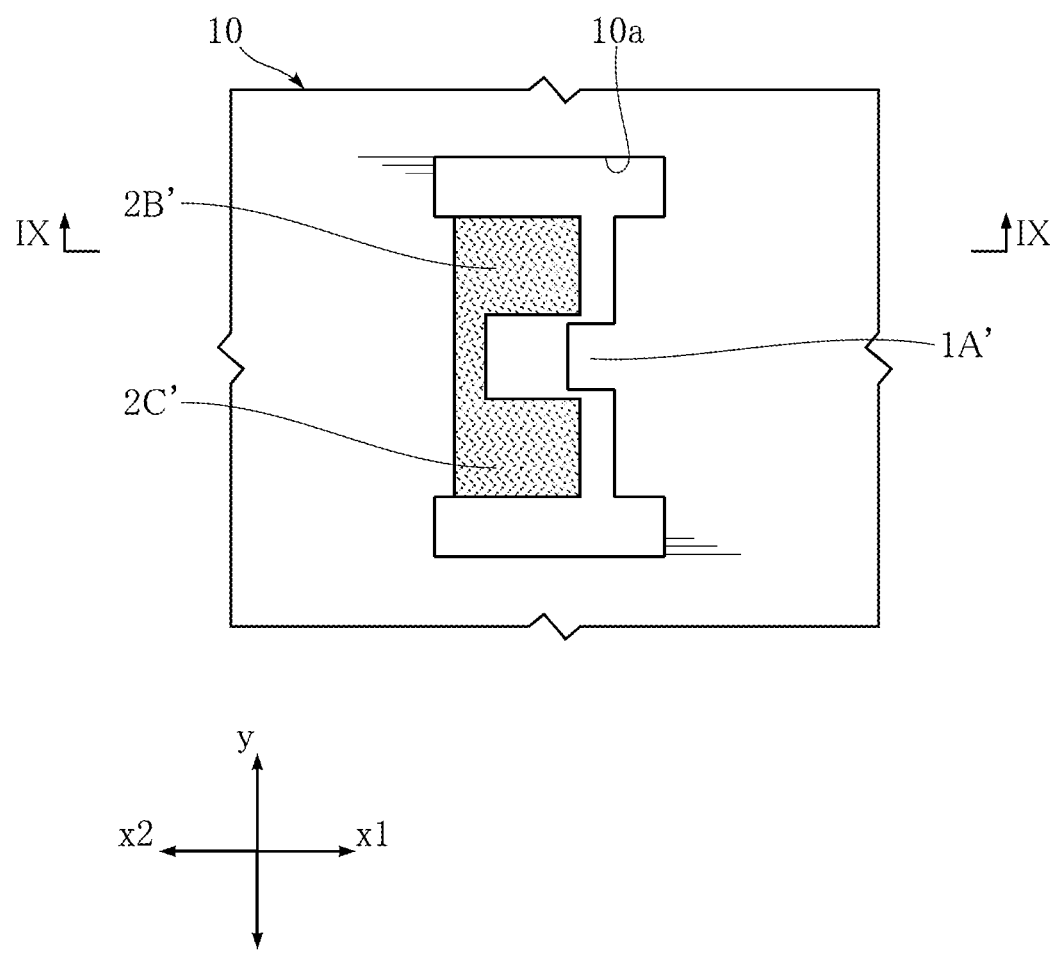
FIG. 8 is a plan view for explaining the manufacturing method of the LED module shown in FIG. 1.
Figure 9:
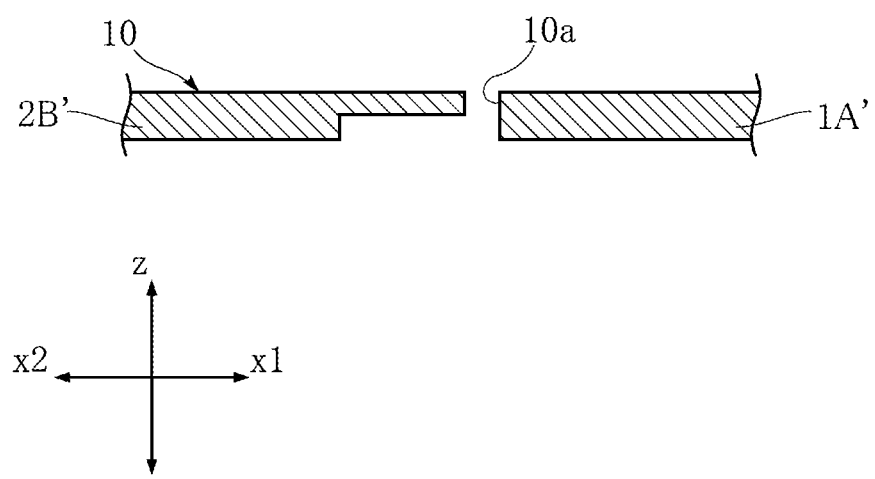
FIG. 9 is a cross-sectional view taken along a line IX-IX in FIG. 8.

Proceeding to FIG. 8, the portion of the metal plate 10 including the second-pole second bulging portion 2B' and the second-pole third bulging portion 2C' is stretched in the x1-x2-direction. Accordingly, the second-pole second bulging portion 2B' and the second-pole third bulging portion 2C' become longer in the x1-direction. In addition, as shown in FIG. 9, the stretched portion becomes thinner than the remaining portion. However, the upper face in FIG. 9 remains flat, and a stepped portion is formed on the lower face. The shaded area in FIG. 8 and the subsequent plan views denotes the thin portions formed by the stretching process.

Figure 10:
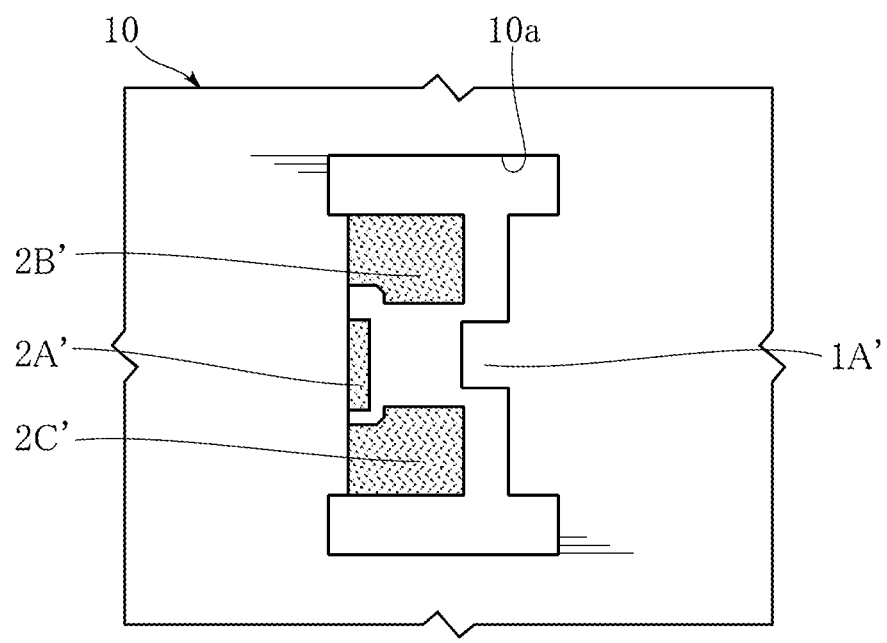
FIG. 10 is a plan view for explaining the manufacturing method of the LED module shown in FIG. 1.
Figure 10:
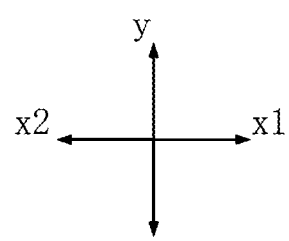

Then, by punching a part of the stretched portion shown in FIG. 8, the metal plate 10 assumes the shape shown in FIG. 10. The punching process changes the shape of the second-pole second bulging portion 2B' and the second-pole third bulging portion 2C'. In addition, a second-pole first bulging portion 2A' is formed between the second-pole second bulging portion 2B' and the second-pole third bulging portion 2C'.

Figure 11:
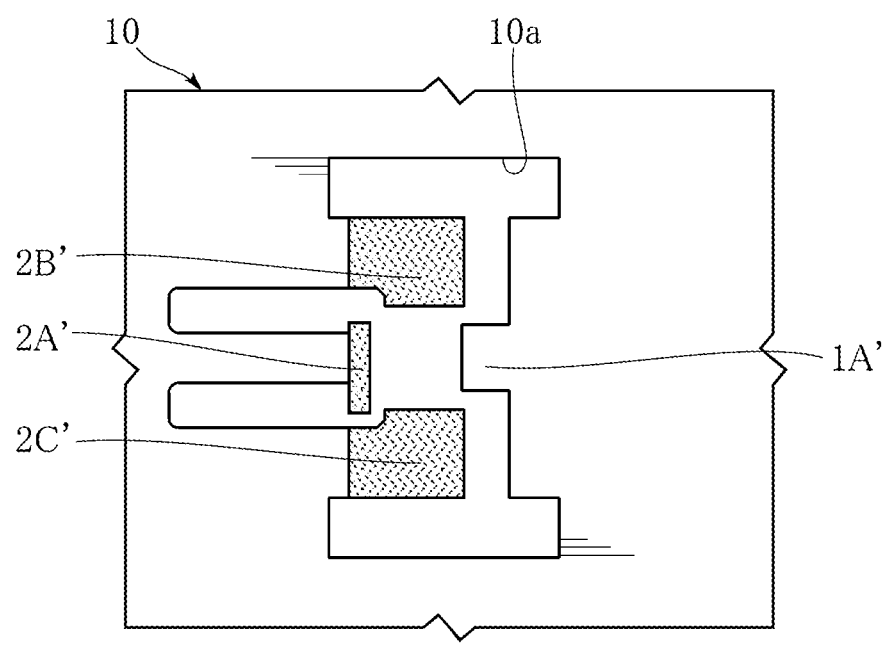
FIG. 11 is a plan view for explaining the manufacturing method of the LED module shown in FIG. 1.
Figure 11:
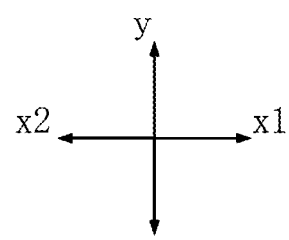

By punching a portion of the metal plate 10 on the x2-direction side with respect to the second-pole first bulging portion 2A', the second-pole second bulging portion 2B', and the second-pole third bulging portion 2C', the metal plate 10 assumes the shape shown in FIG. 11. As shown in FIG. 11, the second-pole first bulging portion 2A', the second-pole second bulging portion 2B', and the second-pole third bulging portion 2C' become longer in the x1-x2-direction.

Figure 12:
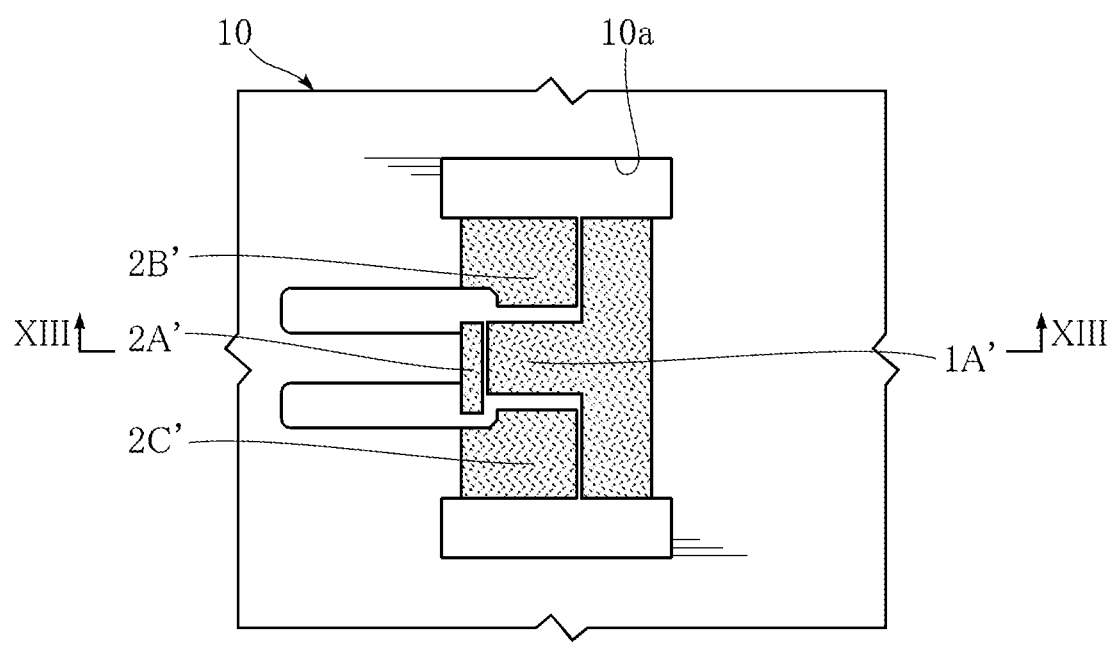
FIG. 12 is a plan view for explaining the manufacturing method of the LED module shown in FIG. 1.
Figure 12:
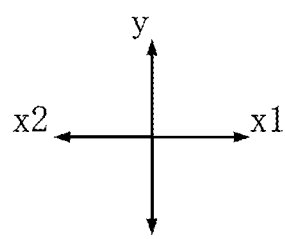
Figure 13:
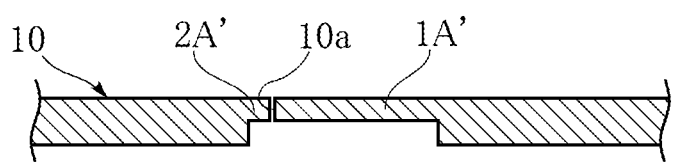
FIG. 13 is a cross-sectional view taken along a line XIII-XIII in FIG. 12.
Figure 13:
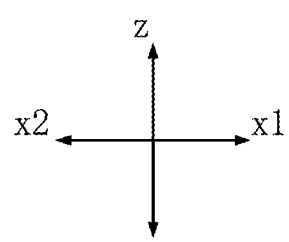

Then the portion of the metal plate 10 including the first-pole first bulging portion 1A' is stretched in the x2-direction, as shown in FIG. 12. As a result, the first-pole first bulging portion 1A' is made even longer in the x1-x2-direction. In addition, as shown in FIG. 13, the stretched portion becomes thinner than the remaining portion as mentioned above.

Figure 14:
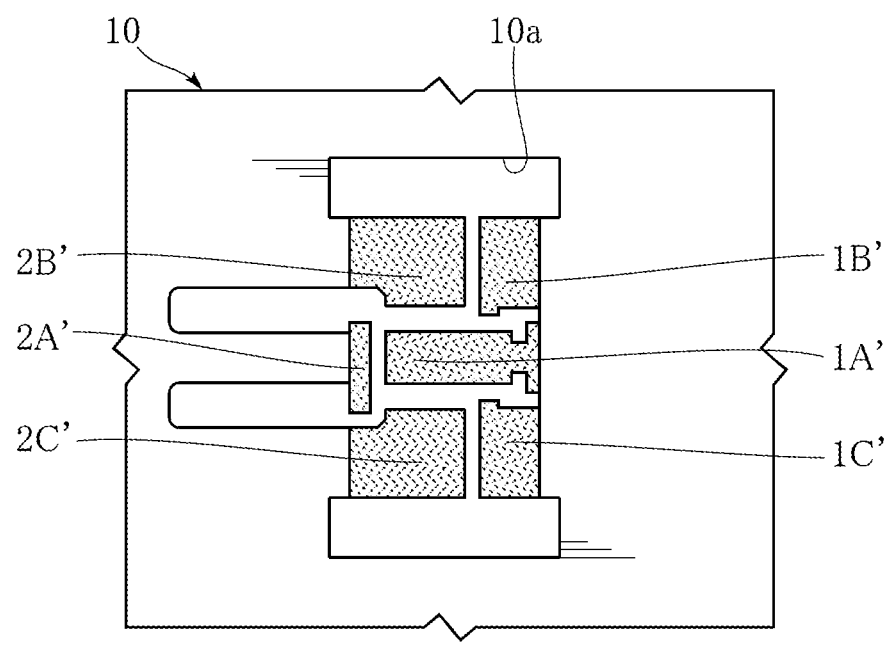
FIG. 14 is a plan view for explaining the manufacturing method of the LED module shown in FIG. 1.
Figure 14:
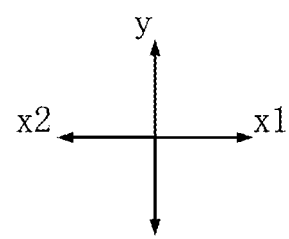

Then by punching a part of the portion stretched as shown in FIG. 12, the metal plate 10 assumes the shape shown in FIG. 14. This punching process changes the shape of the first-pole first bulging portion 1A'. At the same time, a first-pole second bulging portion 1B' and a first-pole third bulging portion 1C' are formed on the respective sides of the first-pole first bulging portion 1A' in the y-direction.

Figure 15:
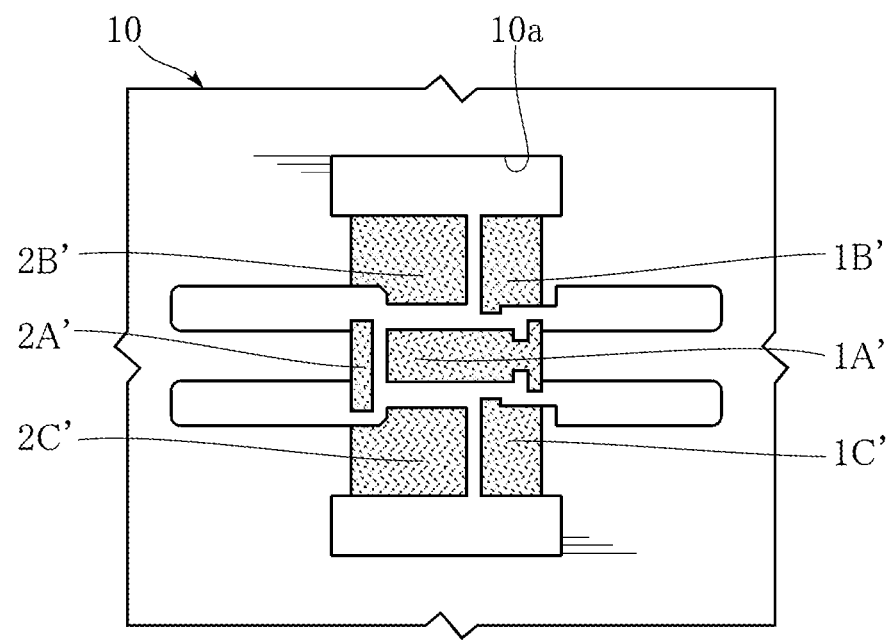
FIG. 15 is a plan view for explaining the manufacturing method of the LED module shown in FIG. 1.
Figure 15:
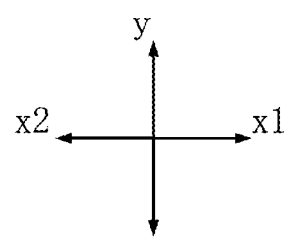

Further, by punching a portion of the metal plate 10 on the x2-direction side with respect to the first-pole first bulging portion 1A', the first-pole second bulging portion 1B', and the first-pole third bulging portion 1C', the shape shown in FIG. 15 is obtained. As shown in FIG. 15, the first-pole first bulging portion 1A', the first-pole second bulging portion 1B', and the first-pole third bulging portion 1C' are made longer in the x1-x2-direction.

Figure 16:
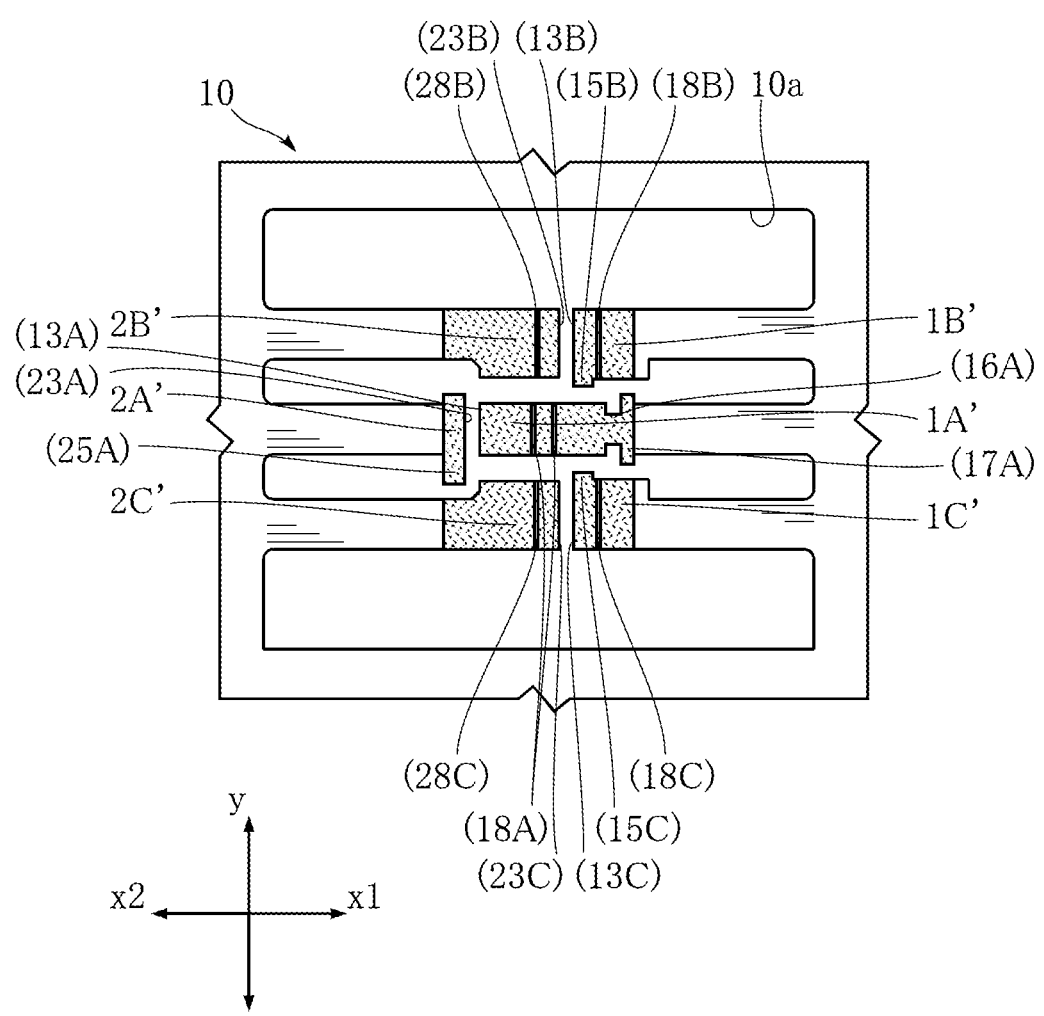
FIG. 16 is a plan view for explaining the manufacturing method of the LED module shown in FIG. 1.

Further, by punching a part of the regions in the metal plate 10 on the respective sides of the first-pole first bulging portion 1A', the first-pole second bulging portion 1B', the first-pole third bulging portion 1C', the second-pole first bulging portion 2A', the second-pole second bulging portion 2B', and the second-pole third bulging portion 2C' in the y-direction, the shape shown in FIG. 16 is obtained. Through the foregoing steps, the portions corresponding to the distal end 13A, the narrowed portion 16A, and the widened portion 17A are formed in the first-pole first bulging portion 1A'. Likewise, the portions corresponding to the distal end 23A and the bulging portion 25A are formed in the second-pole first bulging portion 2A', and the portions corresponding to the distal end 13B and the bulging portion 15B are formed in the first-pole second bulging portion 1B'. Further, the portion corresponding to the distal end 23B is formed in the second-pole second bulging portion 2B', the portions corresponding to the distal end 13C and the bulging portion 15C are formed on the first-pole third bulging portion 1C', and the portion corresponding to the distal end 23C is formed in the second-pole third bulging portion 2C'.

After completing the foregoing steps, the grooves 18A, the groove 18B, the groove 28B, the groove 18C, and the groove 28C are formed. Alternatively, according to an embodiment of the present invention, those grooves mentioned above may be formed in parallel with or simultaneously with the foregoing steps.

Thereafter, the first LED chip 3A is mounted on the first-pole first bulging portion 1A', the second LED chip 3B is mounted on the second-pole second bulging portion 2B', and the third LED chip 3C is mounted on the second-pole third bulging portion 2C'. In addition, the first Zener diode 4A is mounted on the first-pole first bulging portion 1A', the second Zener diode 4B is mounted on the first-pole second bulging portion 1B', and the third Zener diode 4C is mounted on the first-pole third bulging portion 1C'. Then the wires 51 to 58 are bonded in a prescribed manner. After the mentioned mounting and bonding process, the housing 6 is formed. Alternatively, the housing 6 may be formed before the mounting and bonding process. Then the encapsulating resin 7 is formed. Then upon cutting away predetermined positions of the metal plate 10, the LED module A1 shown in FIG. 1 is obtained.

The foregoing LED module A1 and the manufacturing method thereof provide the following advantageous effects.

With the configuration according to the present embodiment, the distal end 13A of the first-pole first lead 1A is located on the x2-direction side (i.e., offset in the x2-direction) with respect to the distal end 23B of the second-pole second lead 2B and the distal end 23C of the second-pole third lead 2C. Accordingly, the first LED chip 3A (mounted on the first-pole first lead 1A) can be brought closer to the second LED chip 3B (mounted on the second-pole second lead 2B) and to the third LED chip 3C (mounted on the second-pole third lead 2C). Thus, the LED module A1 can be formed in a smaller size.

Further, the distal end 13A of the first-pole first lead 1A is located on the x2-direction side with respect to the second LED chip 3B and the third LED chip 3C, which is advantageous to bringing the first LED chip 3A closer to the second LED chip 3B and to the third LED chip 3C.

Still further, the distal end 23B of the second-pole second lead 2B and the distal end 23C of the second-pole third lead 2C are located on the x1-direction side with respect to the first LED chip 3A, which is advantageous to bringing the first LED chip 3A closer to the second LED chip 3B and to the third LED chip 3C.

The first LED chip 3A, the second LED chip 3B, and the third LED chip 3C are disposed so as to at least partially overlap in the x1-x2-direction (in other words, at least partially overlap as viewed in the y-direction), and the centers of the respective chips 3A, 3B and 3C are located at the same position in the x1-x2-direction. This configuration is advantageous to arranging the first LED chip 3A, the second LED chip 3B, and the third LED chip 3C close to each other.

The distal end 23B of the second-pole second lead 2B and the distal end 23C of the second-pole third lead 2C are located at the same position in the x1-x2-direction, which is advantageous to arranging the second LED chip 3B and the third LED chip 3C properly with respect to the first LED chip 3A.

The wire 56 is bonded to the bulging portion 25A of the second-pole first lead 2A, which is advantageous to preventing the wire 56 and the wire 51 from interfering with each other.

The second-pole second lead 2B and the second-pole third lead 2C have a portion that overlaps the bulging portion 25A of the second-pole first lead 2A in the x1-x2-direction, and each of these portions of the leads 2B, 2C is smaller in size measured in the y-direction than the portions of the leads 2B, 2C upon which the second LED chip 3B and the third LED chip 3C are mounted. This configuration is advantageous to preventing the capillary for bonding the wires from interfering with an unexpected part.

The wire 53 is bonded to the bulging portion 15B of the first-pole second lead 1B, which is advantageous to preventing the wire 53 and the wire 57 from interfering with each other. Likewise, the wire 55 is bonded to the bulging portion 15C of the first-pole third lead 1C, which is advantageous to preventing the wire 55 and the wire 58. from interfering with each other.

The first-pole first lead 1A includes the narrowed portion 16A and the widened portion 17A, which is advantageous to preventing the first-pole first lead 1A from coming off from the housing 6.

The two linear portions 62 of the housing 6 are respectively fitted in the two grooves 18A of the first-pole first lead 1A, so that the first-pole first lead 1A is stably held by the linear portions 62. This configuration prevents the first-pole first lead 1A from coming off from the housing 6.

The grooves 18A are located between the first LED chip 3A and the first Zener diode 4A, which is advantageous to preventing the electroconductive joint material 31A and the electroconductive joint material 41A (see FIG. 4) from spreading unduly.

On the first-pole second lead 1B, the linear portion 62 of the housing 6 fitted in the groove 18B serves to prevent the electroconductive joint material for fixing the Zener diode 4B from spreading to the region where the wire 53 is to be bonded. Likewise, on the second-pole second lead 2B the linear portion 62 of the housing 6 fitted in the groove 28B serves to prevent the joint material for fixing the second LED chip 3B from spreading to the region where the wire 57 is to be bonded.

On the first-pole third lead 1C, the linear portion 62 of the housing 6 fitted in the groove 18C serves to prevent the electroconductive joint material for fixing the Zener diode 4C from spreading to the region where the wire 55 is to be bonded. Likewise, on the second-pole third lead 2C the linear portion 62 of the housing 6 fitted in the groove 28C serves to prevent the joint material for fixing the third LED chip 3C from spreading to the region where the wire 58 is to be bonded.

The first-pole first lead 1A, the second-pole first lead 2A, the first-pole second lead 1B, the second-pole second lead 2B, the first-pole third lead 1C, and the second-pole third lead 2C include the thin portion 11A, the thin portion 21A, the thin portion 11B, the thin portion 21B, the thin portion 11C, and the thin portion 21C, respectively. This configuration prevents the six leads 1A, 2A, 1B, 2B, 10 and 2C from coming off from the housing 6.

By stretching the metal plate 10 with the first-pole first bulging portion 1A', the second-pole second bulging portion 2B', and the second-pole third bulging portion 2C', the portions corresponding to the first-pole first lead 1A, the second-pole first lead 2A, the first-pole second lead 1B, the second-pole second lead 2B, the first-pole third lead 1C, and the second-pole third lead 2C are sequentially formed. Through such steps, it is possible to easily and accurately form the first-pole first lead 1A, the second-pole first lead 2A, the first-pole second lead 1B, the second-pole second lead 2B, the first-pole third lead 1C, and the second-pole third lead 2C, respectively including the distal end 13A, the distal end 23A, the distal end 13B, the distal end 23B, the distal end 13C, and the distal end 23C that are shifted from each other in the x1-x2-direction.

Figure 17:
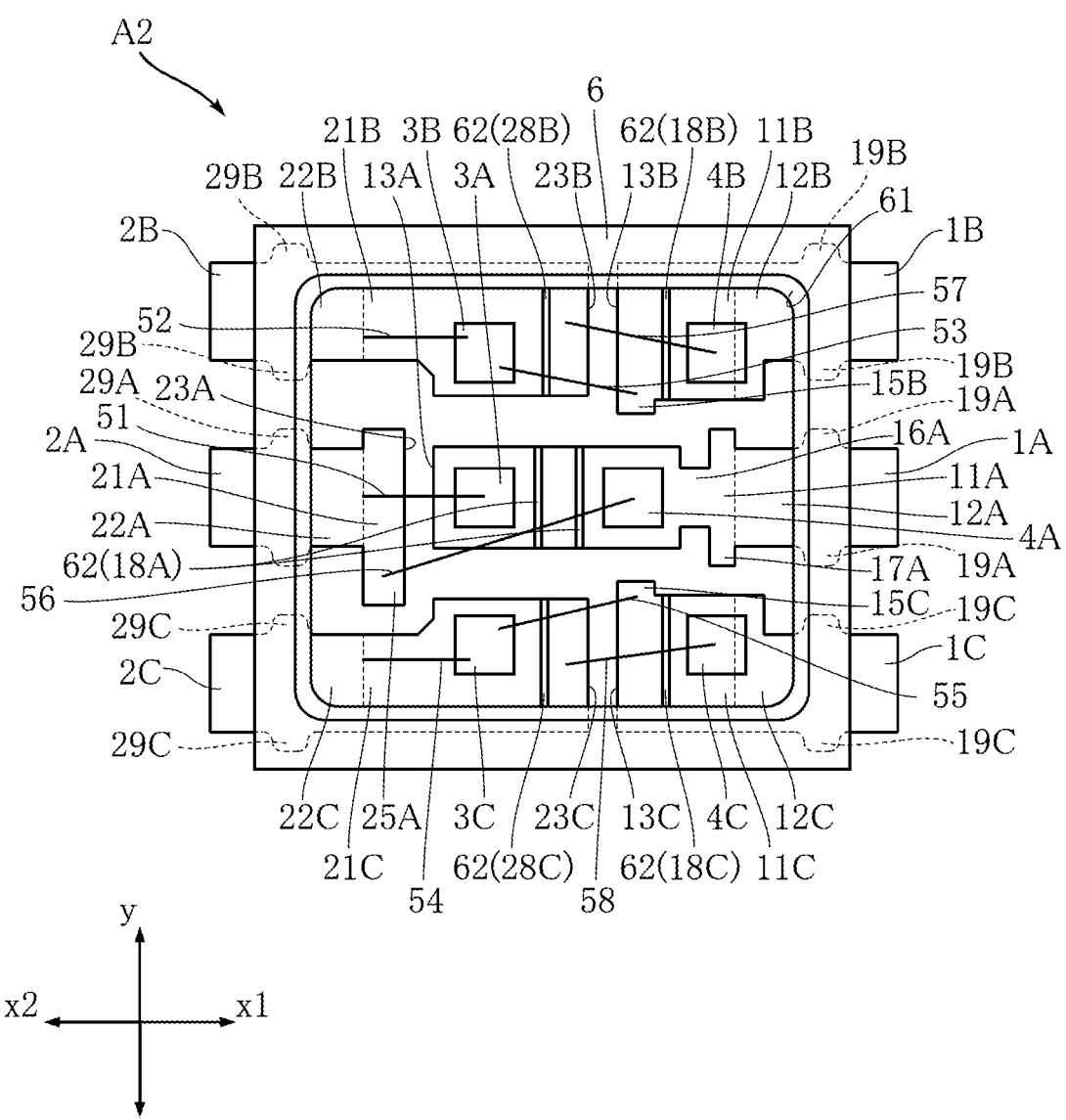
FIG. 17 is a plan view of an LED module according to a second embodiment of the present invention.

FIG. 17 illustrates an LED module according to a second embodiment of the present invention. In FIG. 17, the elements and members that are the same as or similar to those of the first embodiment are given the same reference numeral.

In the LED module A2 according to this embodiment, the first-pole first lead 1A includes a pair of lateral projections or lugs 19A. Similarly, the second-pole first lead 2A includes a pair of lateral lugs 29A, the first-pole second lead 15 includes a pair of lateral lugs 19B, the second-pole second lead 2B includes a pair of lateral lugs 29B, the first-pole third lead 1C includes a pair of lateral lugs 19C, and the second-pole third lead 2C includes a pair of lateral lugs 29C.

The lateral lugs 19A extend oppositely from the thick portion 12A of the first-pole first lead 1A in the y-direction, and the lateral lugs 29A extend oppositely from the thick portion 22A of the second-pole first lead 2A in the y-direction. The lateral lugs 19B extend oppositely from the thick portion 12B of the first-pole second lead 1B in the y-direction, and the lateral lugs 29B extend oppositely from the thick portion 22S of the second-pole second lead 2B in the y-direction. The lateral lugs 19C extend oppositely from the thick portion 12C of the first-pole third lead 1C in the y-direction, and the lateral lugs 29C extend oppositely from the thick portion 22C of the second-pole third lead 2C in the y-direction.

The lateral lugs 19A, 29A, 19B, 29B, 19C and 29C are covered with the housing 6. The lateral lugs 19A, 29A, 19B, 29B, 19C and 29C may be the same in thickness as the thick portion 12A, 22A, 12B, 22B, 12C and 22C, respectively, or the same in thickness as the thin portion 11A, 21A, 11B, 21B, 11C and 21C, respectively.

The LED module A2 according to the second embodiment can also be formed in a small size. In addition, forming the pairs of lateral lugs 19A, 29A, 19B, 29B, 19C and 29C effectively prevents the leads 1A, 2A, 1B, 2B, lead 1C and 2C from coming off from the housing 6.

The LED module and the manufacturing method according to the present invention are not limited to the foregoing embodiments. The configuration of the LED module and the steps of the manufacturing method may be modified in various manners within the scope of the present invention.

The invention claimed is:

1. An LED module comprising:
a support member including a first surface;
a first LED chip, a second LED chip, and a third LED chip that are disposed on the first surface of the support member; and
a first Zener diode, a second Zener diode, and a third Zener diode that are disposed on the first surface of the support member, the first Zener diode, the second Zener diode, and the third Zener diode being electrically connected to the first LED chip, the second LED chip, and the third LED chip, respectively,
wherein the first LED chip overlaps the first Zener diode as viewed in a first direction,
the first LED chip is disposed between the second LED chip and the third LED chip in a plan view,
the first LED chip overlaps with each of the second LED chip and the third LED chip as viewed in a second direction perpendicular to the first direction,
the second Zener diode overlaps the third Zener diode as viewed in the second direction, and
the first Zener diode is spaced apart from each of the second Zener diode and the third Zener diode as viewed in the second direction.

2. The LED module of claim 1, further comprising a first electrode, a second electrode, a third electrode, a fourth electrode, and a fifth electrode that are spaced apart from each other and that are exposed from the support member,
wherein the first LED chip is disposed on the first electrode, and
the second LED chip is disposed on the second electrode.

3. The LED module of claim 2, wherein the third LED chip is disposed on the fourth electrode.

4. The LED module of claim 3, wherein the first Zener diode is disposed on the first electrode.

5. The LED module of claim 4, wherein the second Zener diode is disposed on the third electrode.

6. The LED module of claim 5, wherein the third Zener diode is disposed on the fifth electrode.

7. The LED module of claim 6, further comprising a sixth electrode overlapping the first electrode as viewed in the first direction, the sixth electrode overlapping each of the second electrode and the fourth electrode as viewed in the second direction.

8. The LED module of claim 7, further comprising a first wire bonded to the first LED chip and the sixth electrode.

9. The LED module of claim 2, further comprising a second wire bonded to the second LED chip and the third electrode.

10. The LED module of claim 2, further comprising a third wire bonded to the third LED chip and the fifth electrode.

* * * * *